(12) United States Patent
Ko (10) Patent No.: US 8,196,293 B2
(45) Date of Patent: Jun. 12, 2012

(54) METHOD OF MANUFACTURING A PRINTED CIRCUIT BOARD

(75) Inventor: Young Gwan Ko, Gyunggi-do (KR)

(73) Assignee: Samsung Electro-Mechanics, Co., Gyunggi-Do (KR)

( * ) Notice: Subject to any disclaimer, the term of this patent is extended or adjusted under 35 U.S.C. 154(b) by 250 days.

(21) Appl. No.: 12/634,617

(22) Filed: Dec. 9, 2009

(65) Prior Publication Data

US 2011/0088937 A1    Apr. 21, 2011

(30) Foreign Application Priority Data

Oct. 20, 2009  (KR) .................. 10-2009-0099869

(51) Int. Cl.
*H05K 3/36*    (2006.01)
(52) U.S. Cl. ............... 29/830; 29/825; 29/832; 29/840; 29/846; 29/852; 174/250
(58) Field of Classification Search .............. 29/825, 29/830, 832, 840, 846, 852; 174/250
See application file for complete search history.

(56) References Cited

U.S. PATENT DOCUMENTS

| | | | |
|---|---|---|---|
| 4,180,608 A * | 12/1979 | Del | 428/196 |
| 7,325,300 B2 * | 2/2008 | Tatsumi et al. | 29/852 |
| 8,007,629 B2 * | 8/2011 | Takenaka et al. | 156/307.7 |
| 8,065,797 B2 * | 11/2011 | Watanabe et al. | 29/852 |
| 2008/0052905 A1 * | 3/2008 | Watanabe et al. | 29/846 |
| 2008/0251193 A1 * | 10/2008 | Takenaka et al. | 156/272.2 |

FOREIGN PATENT DOCUMENTS

| | | |
|---|---|---|
| KR | 10-2005-0102453 A | 10/2005 |
| KR | 10-2009-0020208 A | 2/2009 |

OTHER PUBLICATIONS

Office Action from counterpart Korean Patent Application No. 10-2009-0099869, mailed Apr. 20, 2011, 3 pages.

* cited by examiner

*Primary Examiner* — Carl Arbes
(74) *Attorney, Agent, or Firm* — Blakely, Sokoloff, Taylor & Zafman, LLP (57) ABSTRACT

Disclosed are a printed circuit board including a core substrate including core circuit layers on both sides thereof, a first build-up layer formed on one side of the core substrate, a second build-up layer formed on the other side of the core substrate, and first and second protective layers formed on the first and second build-up layers, respectively, wherein the first build-up layer includes a trench circuit layer as an outermost circuit layer formed by a trench technology, the trench circuit layer is embedded in the first protective layer, and an outermost circuit layer of the second build-up layer is embedded in an outermost insulating layer of the second build-up layer, and a method of manufacturing the printed circuit board. Thanks to the formation of the outermost circuit layer by the trench technology, it is difficult to separate the outermost circuit layer from the outermost insulating layer.

14 Claims, 12 Drawing Sheets

FIG.1

Prior art

FIG.2

Prior art

FIG.3

Prior art

Prior art

METHOD OF MANUFACTURING A PRINTED CIRCUIT BOARD

CROSS REFERENCE TO RELATED APPLICATION

This application claims the benefit of Korean Patent Application No. 10-2009-0099869, filed Oct. 20, 2009, entitled "A printed circuit board and a fabricating method the same", which is hereby incorporated by reference in its entirety into this application.

BACKGROUND OF THE INVENTION

1. Technical Field

The present invention relates to a printed circuit board and a method of manufacturing the same.

2. Description of the Related Art

Recently, in order to cope with an increase both in signal transmission speed and density of semiconductor chips, the demand for techniques for directly mounting a semiconductor chip on a PCB is increasing. Thus, the development of a PCB having high density and high reliability capable of coping with the increasing density of the semiconductor chip is required.

The requirements for the PCB having high density and high reliability are closely related to the specs of the semiconductor chip, and may include for example circuit fineness, high electrical properties, high signal transmission structure, high reliability, high functionality and so on. Hence, there is a need for techniques which fabricate a PCB having a fine circuit pattern and micro via-holes in accordance with such requirements.

Typically, examples of a method of forming the circuit pattern of the PCB may include a subtractive process, a full additive process, and a semi-additive process. Among them, a semi-additive process enabling the circuit pattern to be very fine is currently receiving attention.

Figure 1:
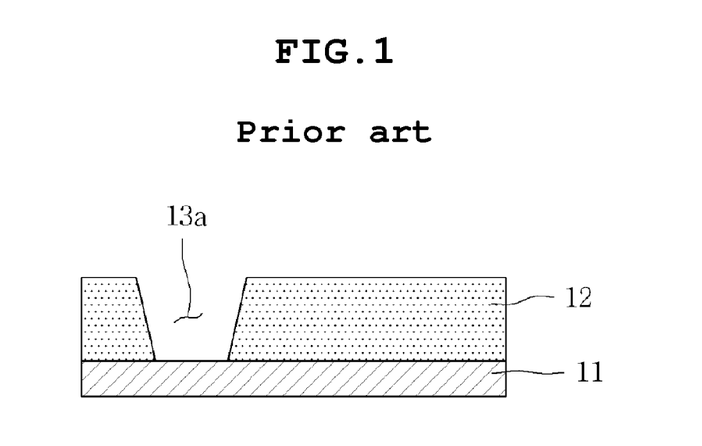
FIGS. 1 to 3 are cross-sectional views sequentially showing a conventional process of manufacturing a printed circuit board using a semi-additive process.
Figure 2:
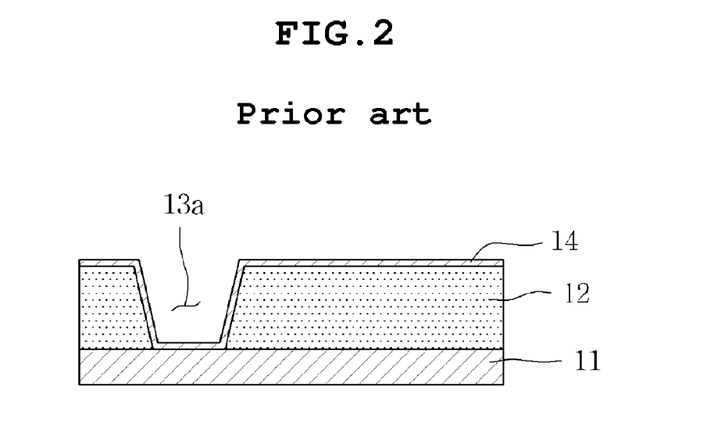
Figure 3:
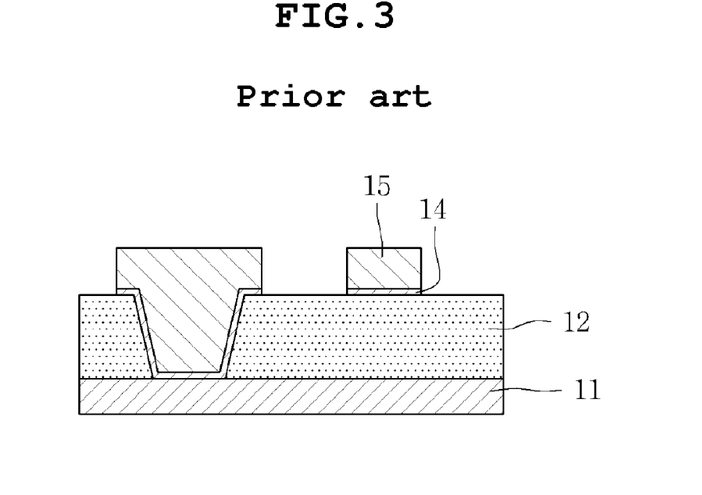

FIGS. 1 to 3 are cross-sectional views sequentially showing a method of forming a circuit pattern through a conventional semi-additive process. With reference to these drawings, the conventional method of forming a circuit pattern is described below.

As shown in FIG. 1, a via-hole 13a is formed in an insulating layer 12 which includes a metal layer 11 provided on one side thereof.

As shown in FIG. 2, an electroless plating layer 14 is formed not only on the to insulating layer 12 but also on an inner surface of the via-hole 13a. In this regard, the electroless plating layer 14 serves as a pretreatment layer adapted for an electrolytic plating process which is executed later. In other words, in order to form an electrolytic plating layer 15, the electroless plating layer 14 must achieve a critical thickness or exceed it (i.e., 1 µm or more).

As shown in FIG. 3, the electrolytic plating layer 15 is formed on the electroless plating layer 14, and then the electroless plating layer 14 is etched to provide a circuit pattern. More specifically, a dry film which has an opening for exposure of the circuit pattern region is layered on the insulating layer 12, and then the electrolytic plating layer 15 is formed in the opening. Subsequently, the region of the electroless plating layer 14 on which the electrolytic plating layer 15 is not formed is removed through flash etching, thus providing the circuit pattern.

However, since the circuit pattern which is prepared through the conventional semi-additive process protrudes from the insulating layer 12 in an embossed manner, the circuit pattern is apt to separate from the insulating layer 12. In particular, as the circuit pattern becomes fine, a contact area between the insulating layer 12 and the circuit pattern is reduced, with the result that an adhesive force at the contact area is diminished and thus the separation of the circuit pattern is intensified. In a multilayered printed circuit board, the separation of the circuit pattern formed on the outermost layer seriously decreases reliability of the printed circuit board.

Recently, new processes for overcoming the above problems are continuously being proposed. Among them, a LPP (Laser Patterning Process) is attracting attention, and is performed in such a manner that trenches are formed on an insulating layer and plating, polishing and etching processes are executed to form a circuit pattern.

FIGS. 3 to 7 are cross-sectional views sequentially showing a conventional LPP forming a circuit pattern. With reference to these drawings, the conventional LPP is to described below.

Figure 4:
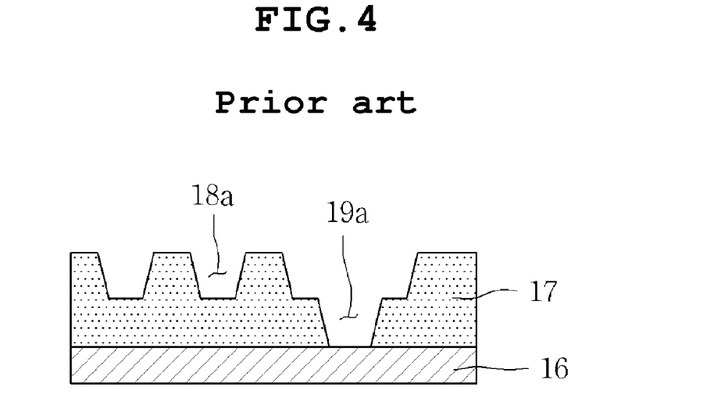
FIGS. 4 to 7 are cross-sectional views sequentially showing another conventional process of manufacturing a printed circuit board using an LPP.

As shown in FIG. 4, pattern trenches 18a and a via trench 19a are formed using a laser in an insulating layer 17 including a metal layer 16 layered on one side thereof.

Figure 5:
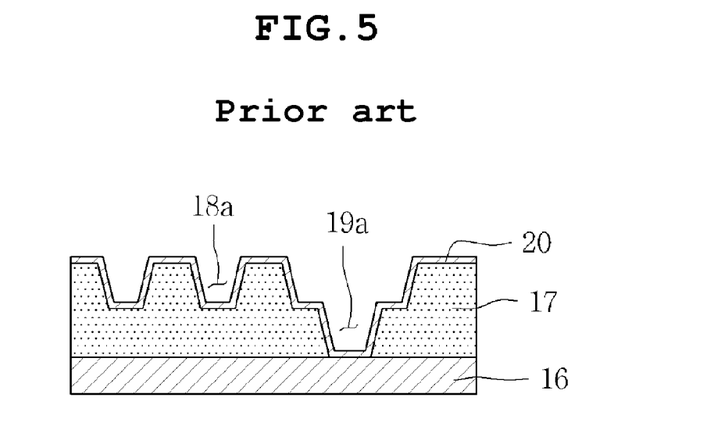

As shown in FIG. 5, an electroless plating layer 20 is deposited not only on the insulating layer 17 but also on inner surfaces of the trenches 18a and 19a.

Figure 6:
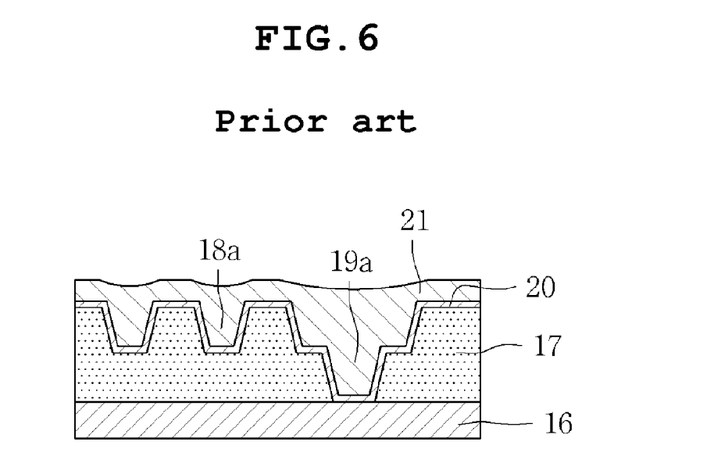

As shown in FIG. 6, an electrolytic plating layer 21 is deposited on the electroless plating layer 20.

Figure 7:
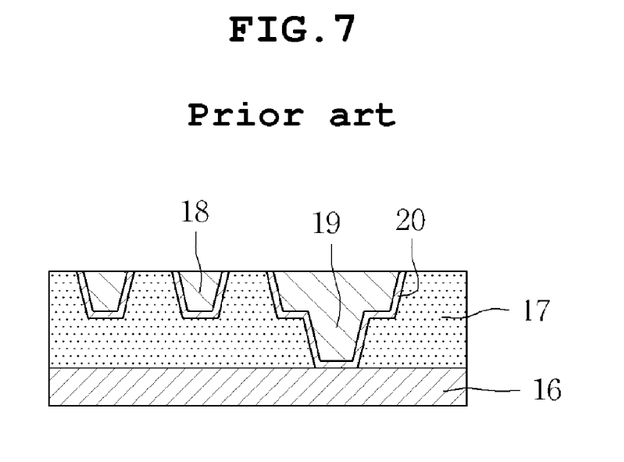

Finally, as shown in FIG. 7, the portions of electroless plating layer 20 and the electrolytic plating layer 21 which are protruding from the insulating layer 17 are removed using an etching process or a grinding process, thus providing an embedded circuit pattern 18 including vias 19 therein.

Manufacturing a printed circuit board using LPP is advantageous because it is possible to prevent the separation of the circuit pattern 18 because the circuit pattern 18 is embedded in the printed circuit board. However, LPP requires an additional grinding process in order to reduce a difference in plating thicknesses between a region with the trenches 18a and 19a and a region without the trenches, and a process of forming the trenches 18a and 19a and a grinding process must be executed at every layer, thus causing extension of lead time. In addition, since process machinery which is used in the formation of the trenches 18a and 19a is expensive, manufacturing costs are correspondingly increased.

Furthermore, although it is also possible to form a fine circuit by forming trenches using an imprint process, the interlayer alignment significantly deteriorates, thus precluding application to a build-up board.

SUMMARY OF THE INVENTION

Accordingly, the present invention has been made keeping in mind the problems encountered in the related art and the present invention is intended to provide a printed circuit board, which is constructed in a build-up manner and which includes an outermost layer having an embedded structure obtained through an imprinting technology which is simply performable, thus minimizing separation of a circuit layer, and a method of manufacturing the same.

Furthermore, the present invention is intended to provide a printed circuit board, in which circuit layers other than the outermost circuit layer are formed using a typical semi-additive process, thus reducing lead time and manufacturing costs and improving interlayer alignment, and a method of manufacturing the same.

In an aspect, the present invention provides a printed circuit board including: a core substrate including core circuit layers on both sides thereof; a first build-up layer formed on one side of the core substrate; a second build-up layer formed on the other side of the core substrate; and first and second protective layers formed on the first and second build-up layers, respectively, wherein the first build-up layer includes a trench circuit layer as an outermost circuit layer formed by a trench technology, the trench circuit layer is embedded in the first protective layer, and an outermost circuit layer of the second build-up layer is embedded in an outermost insulating layer of the second build-up layer.

The printed circuit board may further include a first bump for connecting the core circuit layer to an innermost circuit layer of the first build-up layer and a second bump for connecting the core circuit layer to an innermost circuit layer of the second build-up layer.

Both the first and second bumps may be composed of metal plating layers or electroconductive metal paste.

The first and second protective layers may be each a solder resist layer.

The first protective layer may have a first opening through which a first pad of the trench circuit layer is exposed, and the second protective layer may have a second opening to through which a second pad of the outermost circuit layer of the second build-up layer is exposed.

The first protective layer may include a bump pad which is connected at one side thereof to the trench circuit layer and is exposed to the outside at the other side thereof.

In another aspect, the present invention provides a method of manufacturing a printed circuit board, including: (A) forming core circuit layers on both sides of a core substrate, thus preparing a core layer; (B) forming a first protective layer on one side of a carrier while forming a second protective layer on the other side of the carrier, forming pattern trenches on the first protective layer and plating the pattern trenches, thus creating a trench circuit layer, and forming a first build-up layer on the first protective layer while forming a second build-up layer in the second protective layer, thus preparing a carrier layer; (C) bonding the carrier layer on each side of the core layer; and (D) removing the carrier from each of the carrier layers.

In the method, (A) preparing the core layer may include: (A1) forming a through-hole in the core substrate; (A2) plating the through-hole while forming core circuit layers on the both sides of the core substrate, and forming bumps connected to and protruding from the core circuit layers; and (A3) forming core insulating layers on the both sides of the core substrate such that the bumps pass through the core insulating layers.

The bumps may be composed of metal plating layers or electroconductive metal paste.

In the method, (B) preparing the carrier layer may include: (B1) forming release layers on both sides of the carrier; (B2) forming the first protective layer on the one side of the carrier on which the release layers were formed while forming the second protective layer on the other side of the carrier; (B3) forming the pattern trenches on the first protective layer and plating the pattern trenches, thus creating the trench circuit layer; and (B4) forming the first build-up layer on the first protective layer in which the trench circuit layer was formed while forming the second build-up layer in the second protective layer, thus preparing the carrier layer.

In (C) bonding the carrier layer, the first and second protective layers may be oriented to face outward.

The first and second protective layers may be each a solder resist layer.

The method may further include: (E) forming a first opening in the first protective layer such that a first pad of the trench circuit layer is exposed through the first opening, and forming a second opening in the second protective layer such that a second pad of an outermost circuit layer of the second build-up layer is exposed through the second opening.

In a further aspect, the present invention provides a method of manufacturing a printed circuit board, including: (A) forming core circuit layers on both sides of a core substrate, thus preparing a core layer; (B) forming a first protective layer on one side of a carrier while forming a second protective layer on the other side of the carrier, forming pattern trenches and bump pad trenches on the first protective layer and plating the pattern trenches and the bump pad trenches, thus creating a trench circuit layer and bump pads, and forming a first build-up layer on the first protective layer while forming a second build-up layer in the second protective layer, thus preparing a carrier layer; (C) bonding the carrier layer on each side of the core layer; and (D) removing the carrier from each of the carrier layers.

In the method, (A) preparing the core layer may include: (A1) forming a through-hole in the core substrate; (A2) plating the through-hole while forming core circuit layers on both sides of the core substrate, and forming bumps connected to and protruding from the core circuit layers; and (A3) forming core insulating layers on the both sides of the core substrate such that the bumps pass through the core insulating layers.

The bumps may be composed of metal plating layers or electroconductive metal paste.

In the method, (B) preparing the carrier layer may include: (B1) forming release layers on both sides of the carrier; (B2) forming the first protective layer on the one side of the carrier on which the release layers were formed while forming the second protective layer on the other side of the carrier; (B3) forming the pattern trenches and the bump pad trenches on the first protective layer such that the bump pad trenches lead to an outer surface of the release layer, and plating the pattern trenches and the bump pad trenches, thus creating the trench circuit layer and the bump pads; and (B4) forming the first build-up layer on the first protective layer in which the trench circuit layer was formed while forming the second build-up layer in the second protective layer, thus preparing the carrier layer.

In (C) bonding the carrier layer, the first and second protective layers may be oriented to face outward.

The first and second protective layers may be each a solder resist layer.

The method may further include: (E) forming a second opening in the second protective layer such that a second pad of an outermost circuit layer of the second build-up layer is exposed through the second opening.

BRIEF DESCRIPTION OF THE DRAWINGS

The features and advantages of the present invention will be more clearly understood from the following detailed description taken in conjunction with the accompanying drawings, in which.

DESCRIPTION OF SPECIFIC EMBODIMENTS

Various objects, advantages and features of the invention will become apparent from the following description of embodiments with reference to the accompanying drawings.

The terms and words used in the present specification and claims should not be interpreted as being limited to typical meanings or dictionary definitions, but should be interpreted as having meanings and concepts relevant to the technical scope of the present invention based on the rule according to which an inventor can appropriately define the concept of the term to best describe the method he or she knows for carrying out the invention.

When designating by reference numerals, it should be noted that the same reference numerals are used throughout the different drawings to designate the same or similar components. In the following detailed description, it should be noted that the terms "first", "second" and the like, which are used to indicate various components, are not intended to limit the constituent elements but are intended to differentiate the constituent elements. Also, in the description of the present invention, when it is considered that the detailed description of a related art may obscure the gist of the present invention, such a detailed description may be omitted.

Structure of Printed Circuit Board

Figure 8:
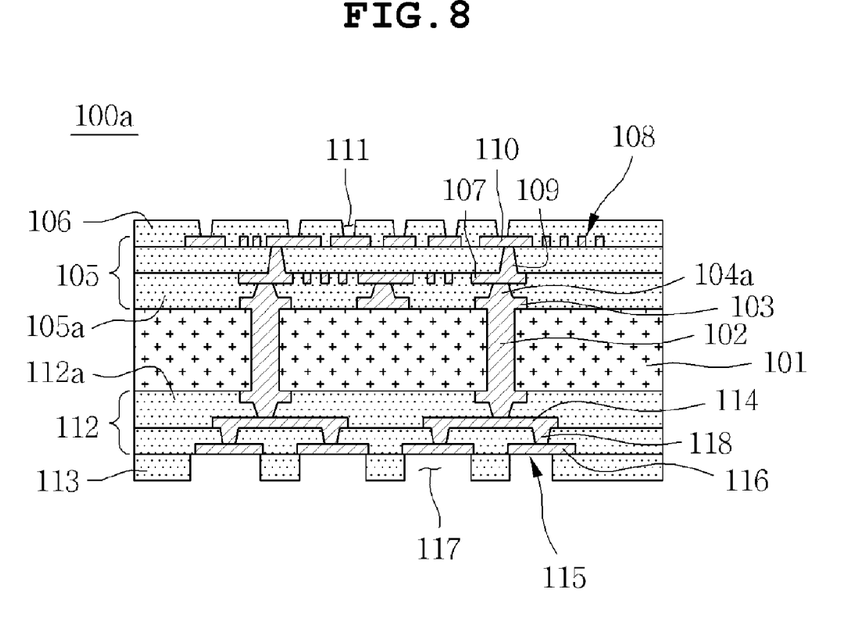
FIG. 8 is a cross-sectional view of a printed circuit board according to a first embodiment of the present invention.

FIG. 8 is a cross-sectional view of a printed circuit board 100a according to a first embodiment of the present invention. With reference to the drawing, the printed circuit board 100a according to this embodiment of the invention is described below.

As shown in FIG. 8, the printed circuit board 100a according to this embodiment is configured such that a core substrate 101, which has through-hole parts 102 and core circuit layers 103 formed on both sides thereof, is provided on one side thereof with a first build-up layer 105 and a first protective layer 106 and is provided on the other side thereof with a second build-up layer 112 and a second protective layer 113, and the outermost circuit layer of the first build-up layer 105 is embodied as a trench circuit layer 108 that is formed using a trench technology.

Although each of the first build-up layer 105 and the second build-up layer 112 is shown in FIG. 8 as being composed of two layers, it is provided only for illustrative purposes and may be composed of a single layer or three or more layers.

The core substrate 101, which is positioned at the center of the printed circuit board 100a to support the printed circuit board 100a, is made of insulating material or metal having high rigidity. In the case where the core substrate 101 is made of metal so as to enhance heat-dissipation efficiency, an insulating layer may be provided on a surface of the core substrate 101 to insulate the core circuit layers 103 and the through-hole parts 102 from the core substrate 101.

The through-hole parts 102 are formed in the core substrate so as to electrically connect the core substrates 103 formed on both sides of the core substrate 101 to each other. The through-hole parts 102 are electrically connected to the core substrate 103, and the through-hole parts 102 and the core substrate 103 may be made of electroconductive metal, such as, gold, silver, nickel and copper.

In this embodiment, bumps 104a may be provided for the electrical connection between the core circuit layer 103 formed on one side of the core substrate 101 and the innermost circuit layer 107 of the first build-up layer 105 and for the electrical connection between the core circuit layer 103 formed on the other side of the core substrate 101 and the innermost circuit layer 114 of the second build-up layer 112. The bumps 104a may be formed by means of metal plating or application of electroconductive metal paste.

The core substrate 101 is provided at one side thereof with the first build-up layer 105 and the first protective layer 106.

The outermost circuit layer of the first build-up layer 105, which is the trench circuit layer 108 formed using a trench-forming technology, is formed in pattern trenches partially formed on one side of the first protective layer 106 in a direction of thickness, using a plating process. The trench circuit layer 108 is configured such that it is embedded in the first protective layer 106 from the interface between the first protective layer 106 and the first build-up layer 105. As a consequence of formation of the outermost circuit layer using the trench technology, the trench circuit layer 108 can have a finer circuit pattern and is hard to be separated from the outermost insulating layer or the first protective layer 106. Meanwhile, the innermost circuit layer 107 of the first build-up layer 105 is electrically connected to the core circuit layer 103 through the bumps 104a. In this embodiment, vias 109 may be further provided for the interlayer connection between a plurality of circuit layers of the first build-up layer 105.

The first protective layer 106 is formed on the first build-up layer 105 to protect the trench circuit layer 108. The first protective layer 106 may be provided with first openings 111 to allow pads of the trench circuit layer 108 to be exposed to the outside. The first protective layer 106 may be made of solder resist.

The core substrate 101 is provided at the other side thereof with the second build-up layer 112 and the second protective layer 113.

The innermost circuit layer 114 of the second build-up layer 112 may be electrically connected to the core circuit layer 103 through the bumps 104a, and the outermost circuit layer 115 of the second build-up layer 112 is embedded in the outermost insulating layer. In this regard, since the outermost circuit layer 115 is embedded, there is lower likelihood of it separating from the outermost insulating layer, as compared to the case where it protrudes from the outermost insulating layer. In this embodiment, vias 118 may be further provided for the interlayer connection between a plurality of circuit layers of the second build-up layer 112.

The second protective layer 113 is formed on the second build-up layer 112 to protect the outermost circuit layer 115, and may have second openings 117 to allow exposure of second pads 116. The second protective layer 113 may be made of solder resist.

The first and second pads 110 and 116 may be further provided thereon with surface treatment layers (not shown). The surface treatment layers serve to prevent corrosion/oxidation of the pads and to enhance adhesive force to solder balls (not shown).

Figure 9:
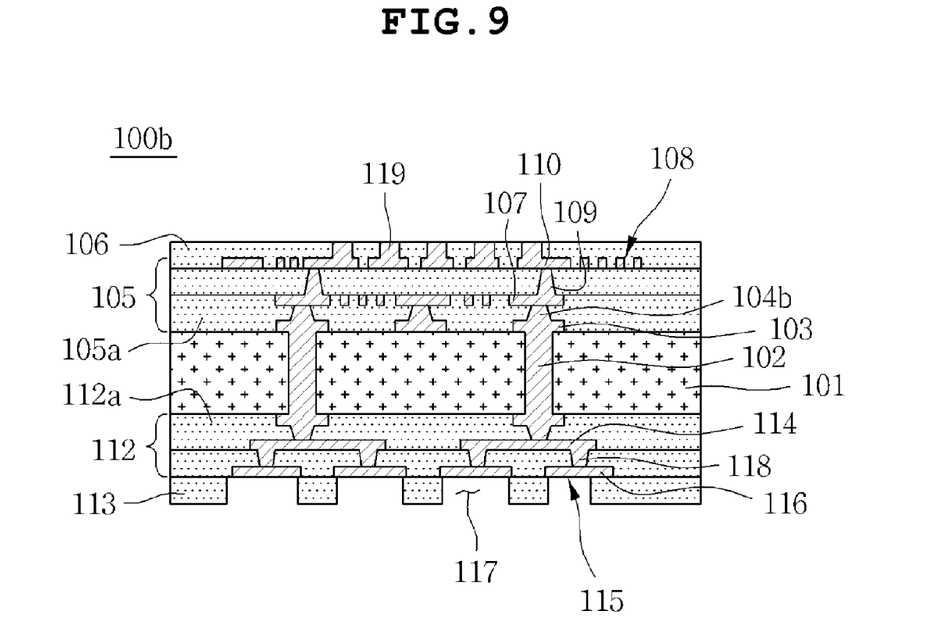
FIG. 9 is a cross-sectional view of a printed circuit board according to a second embodiment of the present invention.

FIG. 9 is a cross-sectional view of a printed circuit board 100b according to a second embodiment of the present invention. With reference to the drawing, the printed circuit board 100b according to this embodiment is described below. In the following description, the same reference numerals are used to designate the components identical or similar to those of the previous first embodiment, and the description which overlaps with the first embodiment will be omitted.

As shown in FIG. 9, the printed circuit board 100b according to this embodiment is configured such that a core substrate 101, which has through-hole parts 102 and core circuit layers 103 formed on both sides thereof, is provided on one side thereof with a first build-up layer 105 and a first protective layer 106, and is provided on the other side thereof with a second build-up layer 112 and a second protective layer 113, and bump pads 119 are formed on the external surface of the trench circuit layer 108.

In this regard, the bump pads 119, which function to connect external devices (not shown) to the trench circuit layer 108, are connected at one side thereof to the trench circuit layer 108 and are exposed to the outside at the other side thereof. The exposed surfaces of the bump pads 119 may be configured to be flush with the upper surface of the first protective layer 106. The exposed surfaces of the bump pads 119 may be further provided thereon with a surface treatment layer (not shown).

Method of Manufacturing a Printed Circuit Board

With reference to FIGS. 10 to 20, a method of manufacturing a printed circuit board, according to a first embodiment of the present invention is described below.

Figure 10:
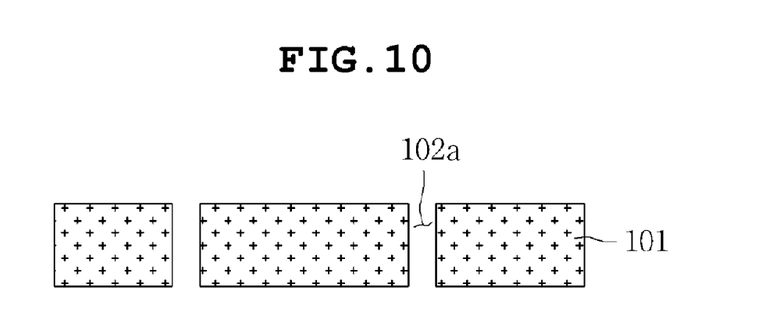
FIGS. 10 to 20 are cross-sectional views sequentially showing a method of manufacturing the printed circuit board shown in FIG. 8.

As shown in FIG. 10, through-holes 102a are first formed in a core substrate 101.

Figure 11:
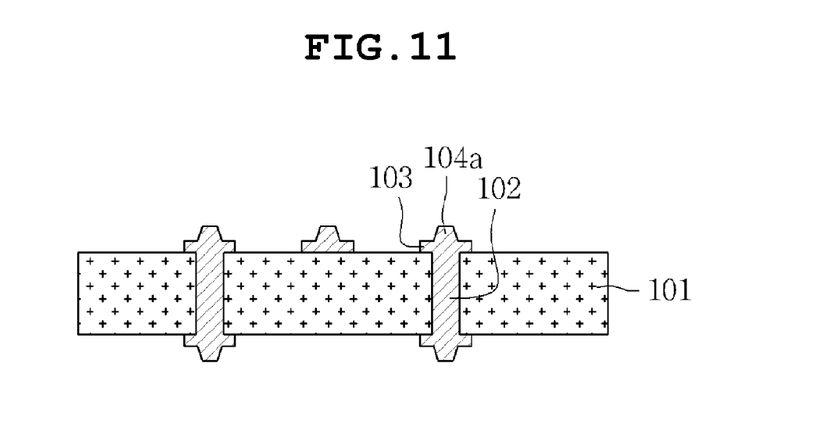

At this point, the through-holes 102a may be formed through laser machining using for example a $CO_2$ laser or drill machining Subsequently, as shown in FIG. 11, the through-holes 102a are plated to form through-hole parts 102, and then a core circuit layers 103 and bumps 104a are formed thereon.

The core circuit layers 103 may be formed using SAP (Semi-Additive Process), MSAP (Modified Semi-Additive Process) or a subtractive process, which are commonly known in the art. At this time, since the core circuit layers 103 are formed using semi-additive process and the like, there is no problem of interlayer misalignment and a considerable reduction of manufacturing costs compared to LPP.

The bumps 104a may be formed by a metal plating layer or electroconductive metal paste. In this embodiment, the bumps 104a are described as being formed by a metal plating layer, and are described as being formed by electroconductive metal paste in a second embodiment.

The bumps 104a are provided for forming the electrical connection between the core circuit layer 103 and the innermost circuit layer 107 of the first build-up layer 105 (to be described later) as well as for the electrical connection between the core circuit layer 103 and the innermost circuit layer 114 of the second build-up layer 112. The bumps 104a are configured to protrude from the circuit layer 103. The bumps 104a may be integrally formed along with the core circuit layers 103 by executing a plating process once, or may be separately formed by executing a plating process after formation of the core circuit layers 103. The process of forming the bumps 104a is not limited to the above-mentioned processes but may be formed using any other process as long as the process can electrically connect the core circuit layers 103 to the innermost circuit layer 107 or 114.

Since the plated through-hole parts 102 are used for the electrical connection between the core circuit layers 103 formed on both sides of the core substrate 101, they can be electrically connected to the core circuit layers 103.

In this regard, the through-hole parts 102 and core circuit layers 103 may be concurrently formed by executing a plating process once.

Figure 12:
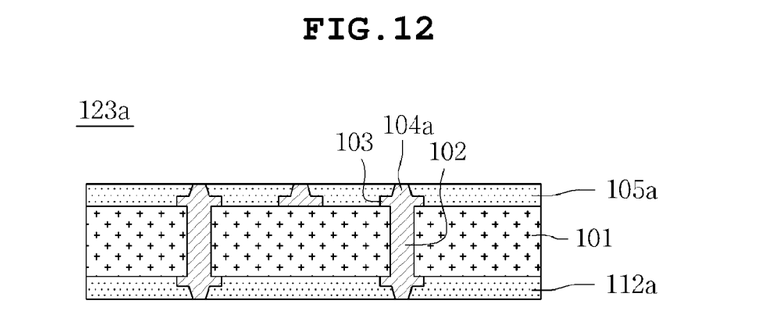

Subsequently, as shown in FIG. 12, core insulating layers 105a and 112a are layered on both sides of the core substrate on which the core circuit layers 103 and the bumps 104a are formed, thus preparing a core layer 123a.

More specifically, the first core insulating layer 105a is layered on one side of the core substrate 101 and the second core insulating layer 112a is layered on the other side of the core substrate 101. Since the core insulating layers 105a and 112a are passed through by the bumps 104a and outer surfaces of the bumps 104a are connected to innermost circuit layers 107 and 114, the outer surfaces of the bumps 104a may be flush with outer surfaces of the core insulating layers 105a and 112a. Alternatively, because the core insulating layers 105a and 112a may be compressed at the time of bonding of a carrier layer 124a, the core insulating layer 105a and 112a may be formed to be higher than the outer surfaces of the bumps.

It should be noted that the first core insulating layer 105a is included in the first build-up layer 105 and the second core insulating layer 112a is included in the second build-up layer 112.

Figure 13:
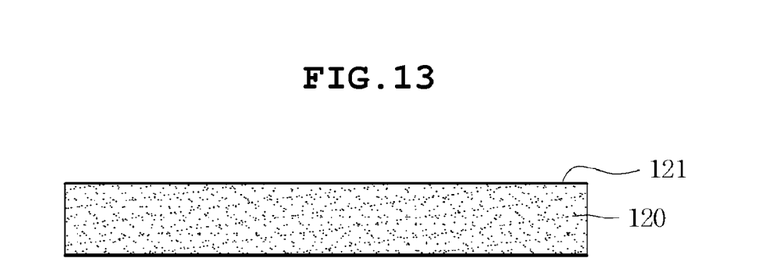

Subsequently, as shown in FIG. 13, release layers 121 are formed on both sides of a carrier 120.

The carrier 120, which serves as a support in the manufacturing process of the printed circuit board 100a, may be made of stainless steel or organic resin. In particular, the carrier 120 made of stainless steel is advantageous in respect of easy separation from the printed circuit board.

The release layers 121 function to allow the carrier 120 to be easily separated from the printed circuit board 100a at the time of removal of the carrier 120 from the printed circuit board. The release layers 121 may be made of one or more insulating materials selected from the group consisting of epoxy resin, polyimide, phenol, fluorine resin, PPO (Poly Phenylene Oxide) resin, BT (Bismaleimide Triazine) resin, glass fiber and paper.

Figure 14:
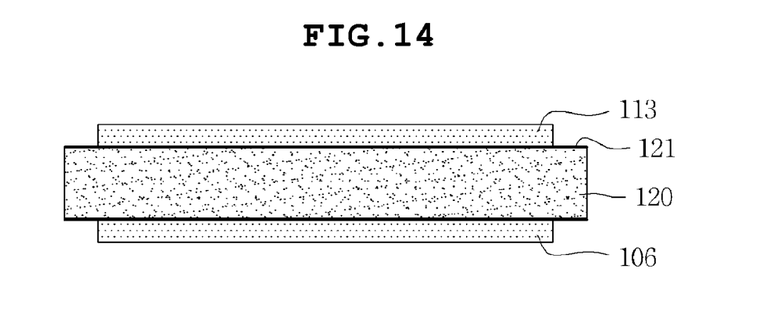

As shown in FIG. 14, a first protective layer 106 and a second protective layer 113 are formed on the release layers 121 layered on the carrier 120.

The first protective layer 106 and the second protective layer 113 serve as the outermost layers of the printed circuit board 100a for protecting a trench circuit layer 108 and an outermost circuit layer 115 which will be described later. The first protective layer 106 and the second protective layer 113 may be made of insulating material, for example, solder resist such as liquid solder resist.

Figure 15:
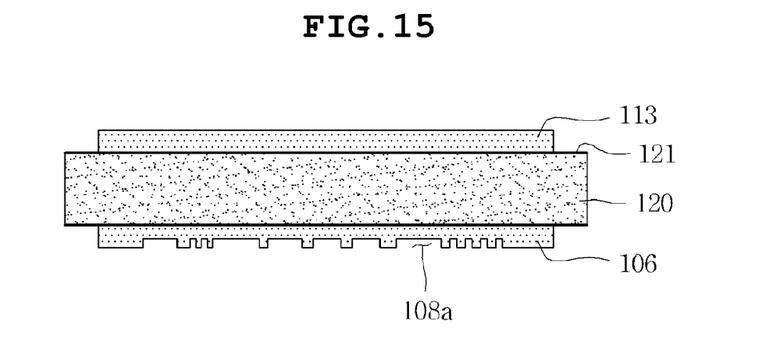

As shown in FIG. 15, pattern trenches 108a are formed in the first protective layer 106.

At this point, the pattern trenches 108a may be formed by an imprinting process. In the case of applying the imprinting process, the first protective layer 106 is pressed by an imprint mold configured to correspond to the profiles of the pattern trenches 108a, thus creating the pattern trenches 108a in the first protective layer 106. In this case, machining time and costs are reduced compared to other processes. Alternatively, the pattern trenches 108a may also be formed by a laser process, for example, an excimer laser process.

Figure 16:
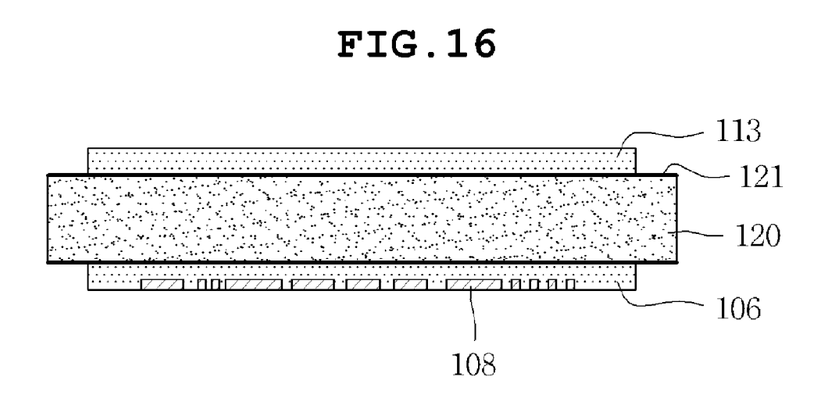

Subsequently, as shown in FIG. 16, the pattern trenches 108a are plated, thus providing the trench circuit layer 108.

More specifically, an electroless plating layer is formed in the pattern trenches 108a as well as on the first protective layer 106, and then an electrolytic plating layer is formed on the electroless plating layer, thus creating the trench circuit layer 108. The electroless plating layer and the electrolytic plating layer may be removed by a mechanical and/or chemical polishing process such that the electroless plating layer and the electrolytic plating layer are flush with a surface of the first protective layer 106 (embedded structure).

The trench circuit layer 108, which serves as an outermost circuit layer provided on the side of the printed circuit board 100a, is formed by a trench technology, thus reducing the risk of the outermost circuit layer becoming separated from the outermost insulating layer.

Figure 17:
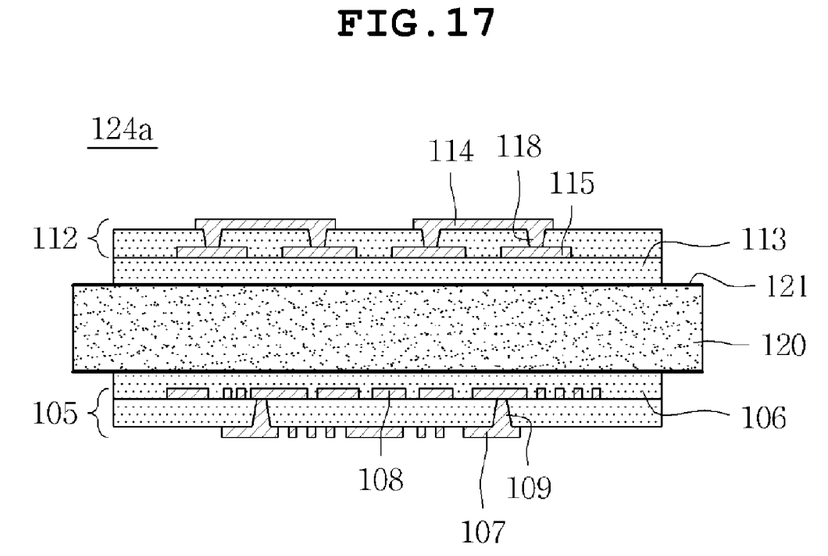

As shown in FIG. 17, a first build-up layer 105 is formed on the first protective layer 106 including the trench circuit layer 108, and a second build-up layer 112 is formed on the second protective layer 113, thus preparing a carrier layer 124a.

At this point, the circuit layer of the first build-up layer 105 and the second build-up layer 112 excluding the trench circuit layer 108 may be formed by a typical process, like the core circuit layers 103. Consequently, there is no problem of interlayer misalignment and manufacturing time and manufacturing costs are relatively reduced. The outermost circuit layer 115 of the second build-up layer 112 may be formed by a tenting technology, thus considerably reducing manufacturing costs. In this embodiment, vias 109 and 118 may be further provided for the electrical connection between circuit layers. The first build-up layer 105 and the second build-up layer 112 may be composed of a single layer or a plurality of layers.

Figure 18:
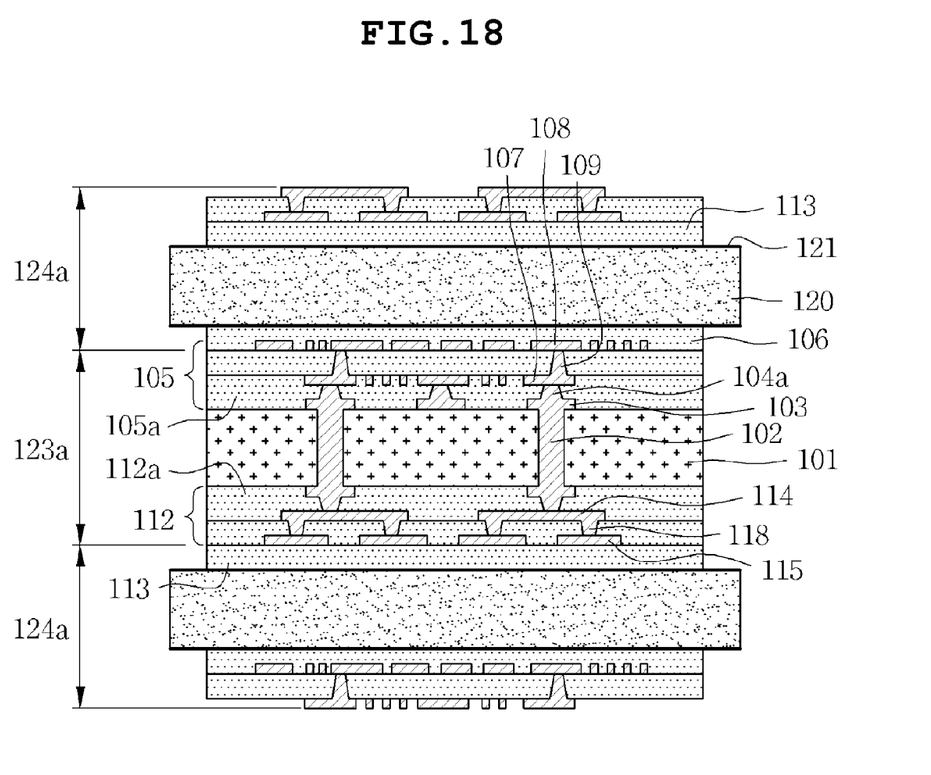

Subsequently, as shown in FIG. 18, the carrier layers 124a are bonded to both sides of the core layer 123a.

At this point, the carrier layers 124a are bonded such that the first protective layer 106 and the second protective layer 113 face outward. The innermost circuit layer 107 of the first build-up layer 105 and the innermost circuit layer 114 of the second build-up layer 112 are embedded in the first core insulating layer 105a and the second core insulating layer 112a, respectively, and connected to the bumps 104a formed on both sides of the core layer 123a, with the result that the innermost circuit layers 107 and 114 are electrically connected to the core circuit layers 103.

Since the second build-up layer 112 is bonded to the core layer 123 in the direction opposite to the build-up direction so that the outermost circuit layer 115 of the second build-up layer 112 is embedded in the outermost insulating layer, the risk of separation of the outermost circuit layer 115 is reduced.

The core layer 123a and the carrier layer 124a can be bonded to each other through a semi-cured insulating layer or adhesive for a printed circuit board.

Figure 19:
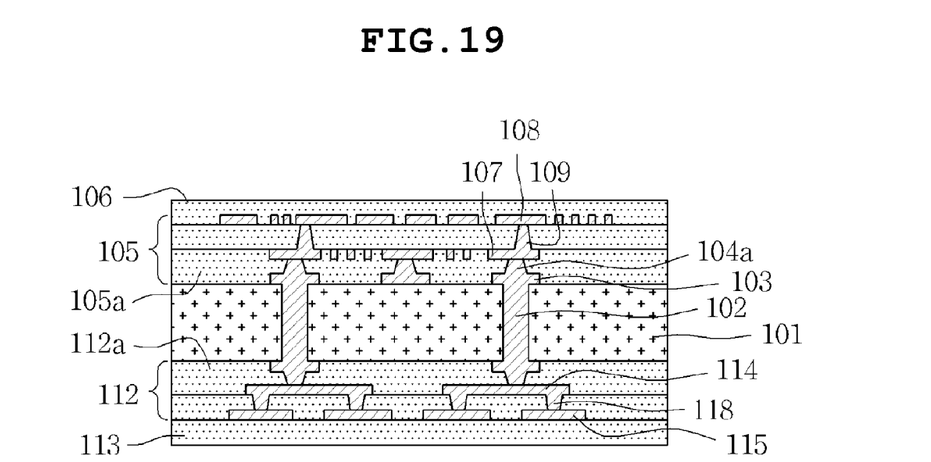

Subsequently, as shown in FIG. 19, the carriers 120 are removed, and thus the printed circuit board is obtained from between the carriers 120.

At this point, in the case where the release layers 121 are provided, the carrier 120 can be easily separated from the printed circuit board.

Figure 20:
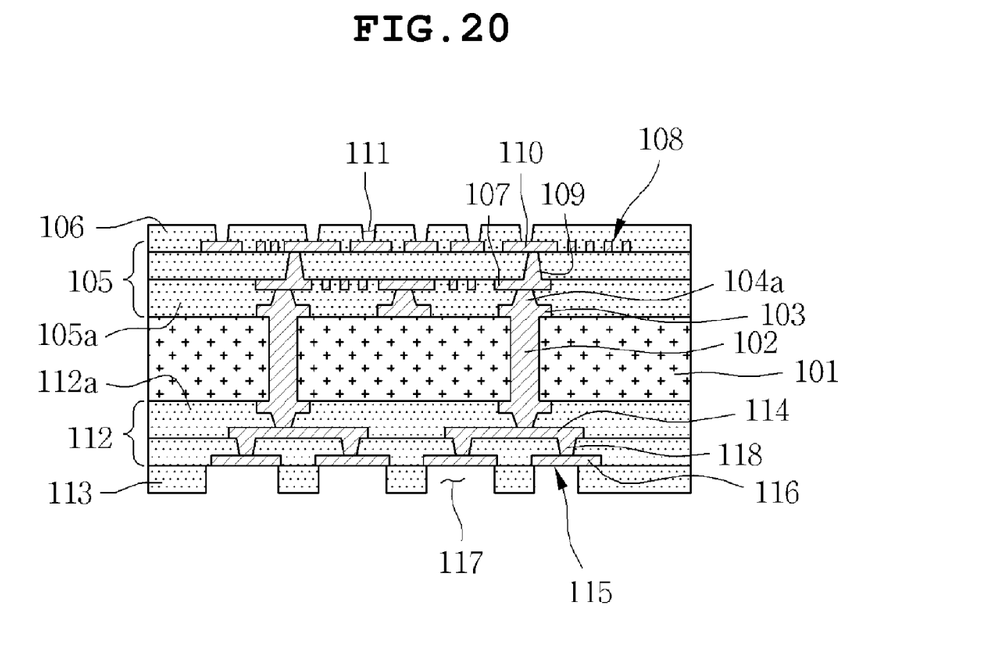

As shown in FIG. 20, first openings 111 are formed in the first protective layer 106, and second openings 117 are formed in the second protective layer 113.

More specifically, the first openings 111 through which the first pads 110 of the trench circuit layer 108 are exposed are formed in the first protective layer 106, and second openings 117 through which the second pads 116 of the outermost circuit layer 115 of the second build-up layer 112 are formed in the second protective layer 113. In this regard, the first openings 111 and the second openings 117 may be formed by laser machining, drill machining, imprinting or the like. When the first openings 111 and the second openings 117 are formed by the laser machining, the first pads 110 and the second pads 116 are made of metal and thus can serve as a stopper.

Subsequently, the first pads 110 and the second pads 116 may be additionally provided with solder balls (not shown) for forming the connection to external devices (not shown).

Although not shown in the drawings, surface treatment layers (not shown) may be further provided so as to enhance an adhesive force between the first and second pads 110 and 116 and the solder balls (not shown) and to prevent corrosion/oxidation. For example, the surface treatment layers (not shown) may be embodied by forming only nickel plating layers or nickel alloy plating layers on the first pads 110 and the second pads 116, or may be embodied by forming either or both of palladium plating layers and gold plating layers on the nickel plating layers or the nickel alloy plating layers. In the case where both the palladium plating layers and the gold plating layers are formed, the palladium plating layers and the gold plating layers are formed in this order.

As a consequence of the above-described manufacturing process, the printed circuit board 100a according to the first embodiment of the present invention is obtained, as shown in FIG. 20.

With reference to FIGS. 21 to 32, a method of manufacturing a printed circuit board 100b according to a second embodiment of the present invention is described below. In the following description, the same reference numerals are used to designate the components identical or similar to those of the previous first embodiment, and description overlapping the first embodiment will be omitted.

Figure 21:
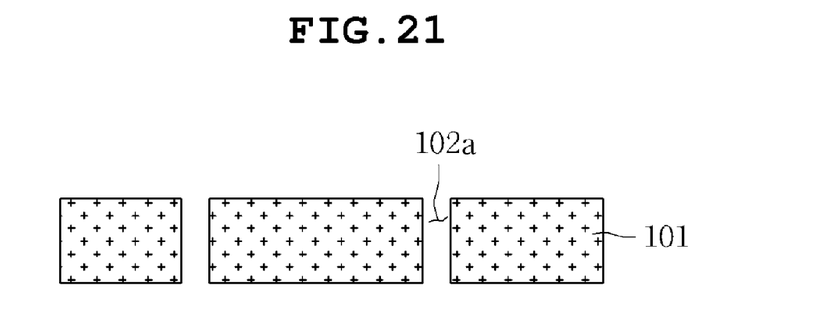
FIGS. 21 to 32 are cross-sectional views sequentially showing a method of manufacturing the printed circuit board shown in FIG. 9.
Figure 22:
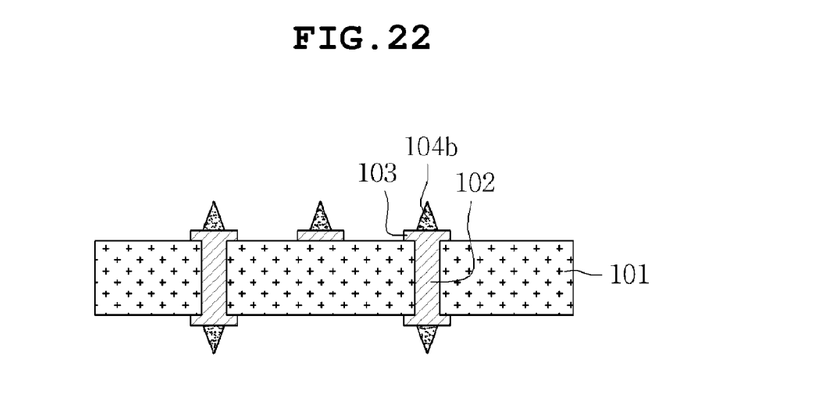
Figure 23:
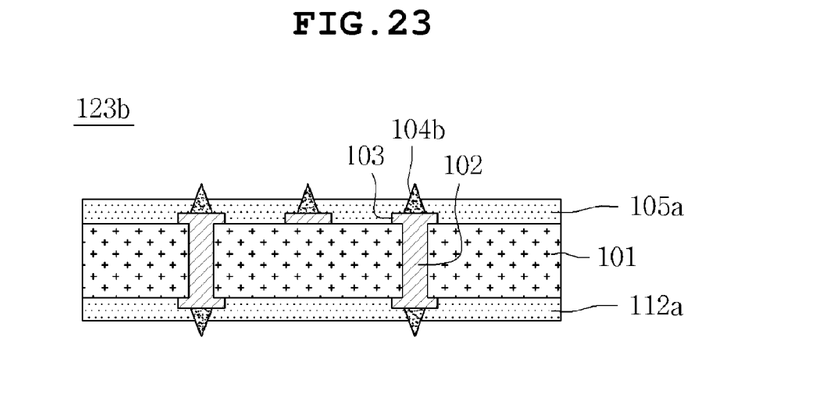
Figure 24:
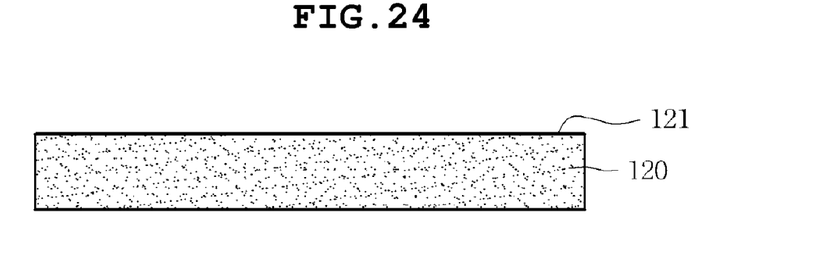
Figure 25:
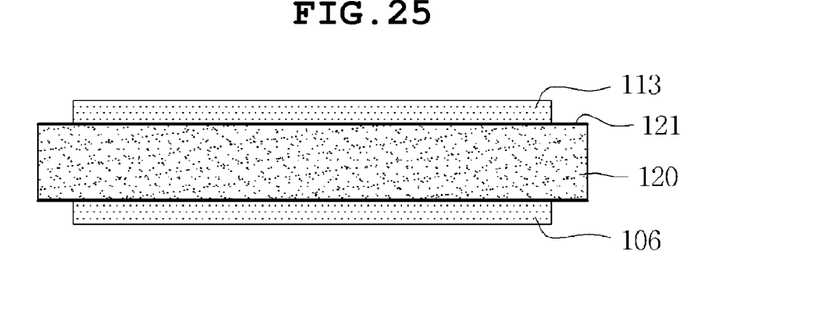

As shown in FIGS. 21 to 23, through-holes 102a are formed in a core substrate 101 and are then plated. Core circuit layers 103 and bumps 104b are formed on both sides of the core substrate 101, thus preparing a core layer 123b.

In this embodiment, the bumps 104b may be formed by printing electroconductive metal paste such as gold, silver, nickel or copper. The formation of the bumps is not limited to the above process but may be embodied by plating as in the first embodiment.

As shown in FIGS. 24 to 28, release layers 121 are formed on both sides of a carrier 120, and a first protective layer 106 and a second protective layer 113 are formed on the release layers 121. Pattern trenches 108a and bump pad trenches 119a are formed in the first protective layer 106 and then are plated, and a first build-up layer 105 and a second build-up layer 112 are formed, thus preparing a carrier layer 124b.

Figure 26:
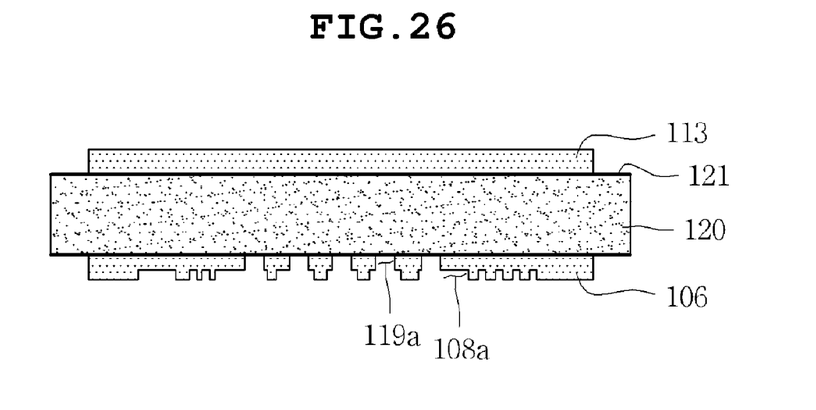

At this point, the bump pad trenches 119a are formed concurrently with the pattern trenches 108a. In the case where the pattern trenches 108a are formed by the imprint technology, the bump pad trenches 119a may be concurrently formed by extending a part of an imprint mold, or may be separately formed by $CO_2$ laser. The bump pad trenches 119a may be formed such that they reach interface between the release layer 121 and the first protective layer 106.

Figure 27:
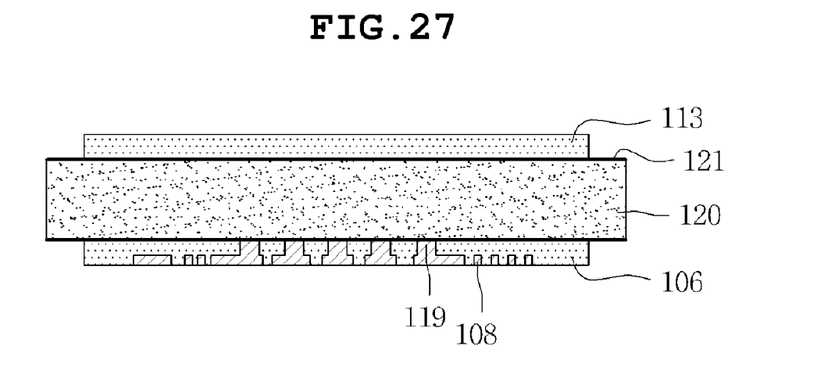
Figure 28:
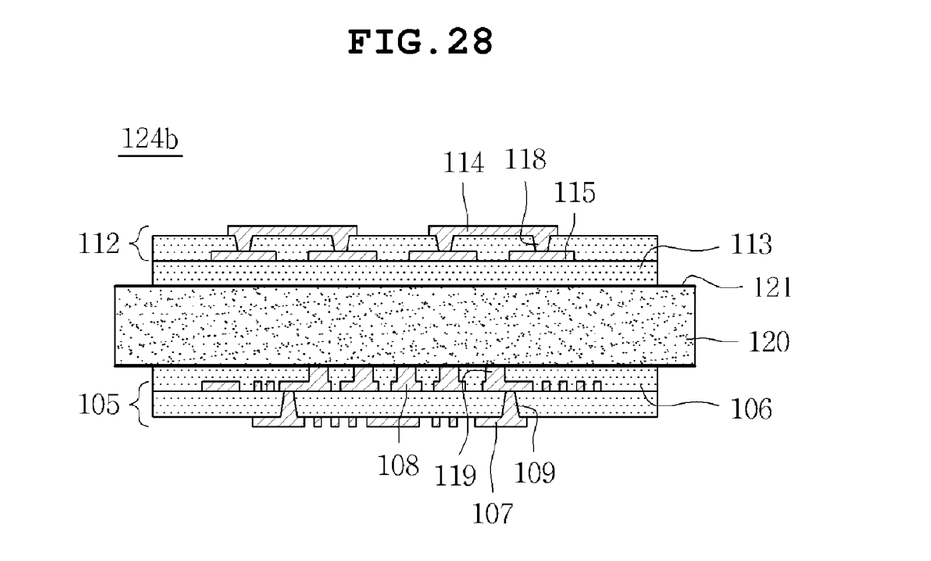

The pattern trenches 108a and the bump pad trenches 109a are plated such that bump pads 119 which are connected at one side thereof to the trench circuit layer 108 and are exposed at the other side thereof are formed in the first protective layer 106. The exposed surfaces of the bump pads 119 and the outer surface of the first protective layer 106 are flush with each other.

Figure 29:
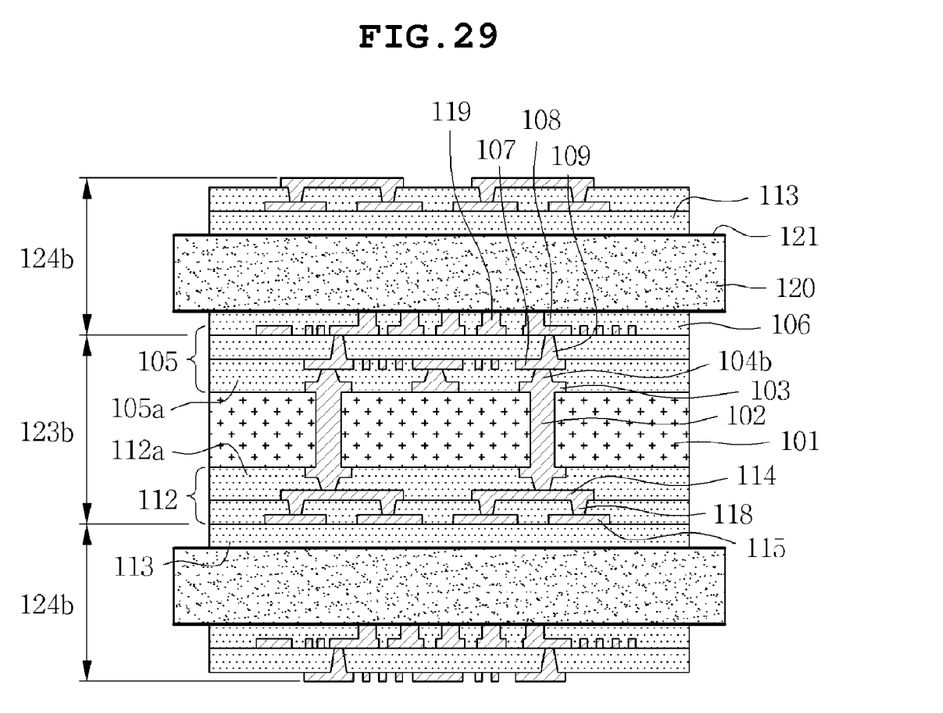
Figure 30:
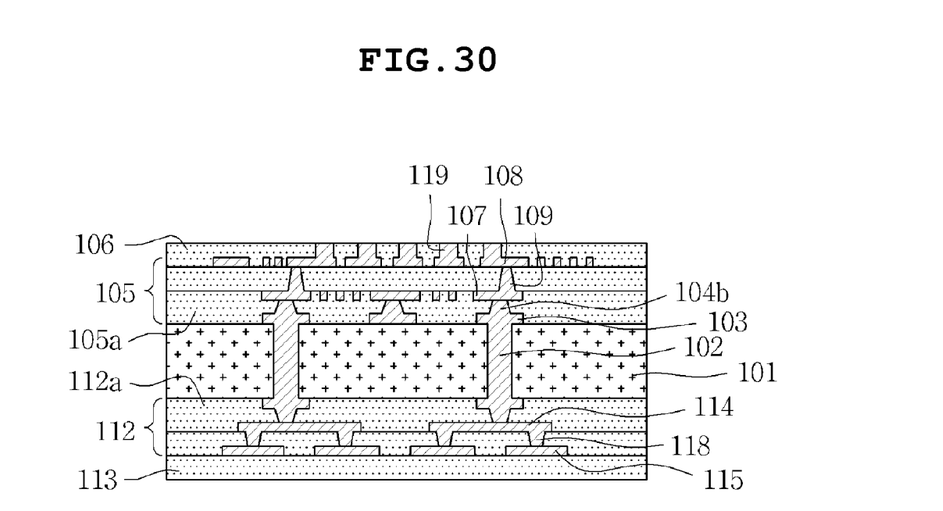
Figure 31:
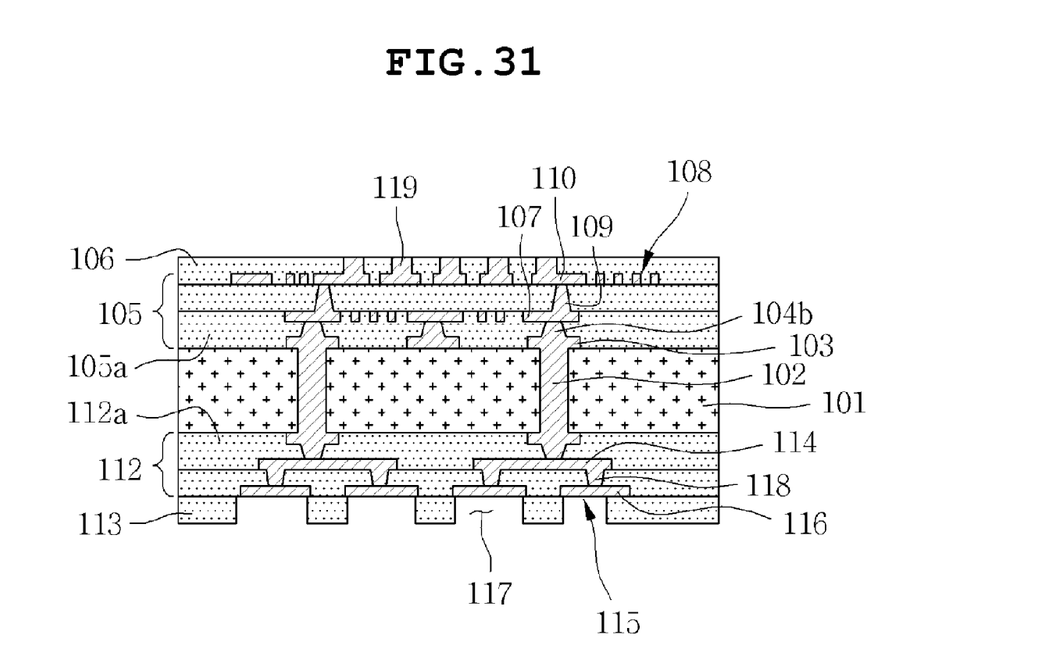

As shown in FIGS. 29 to 31, the carrier layers 124b are bonded to both sides of the core layer 123b, and the carriers 120 are removed. Subsequently, second openings 117 are formed, thus preparing the printed circuit board 100b.

At this point, the bump pads 119 may be further provided with a surface treatment layer (not shown) and solder balls (not shown).

Figure 32:
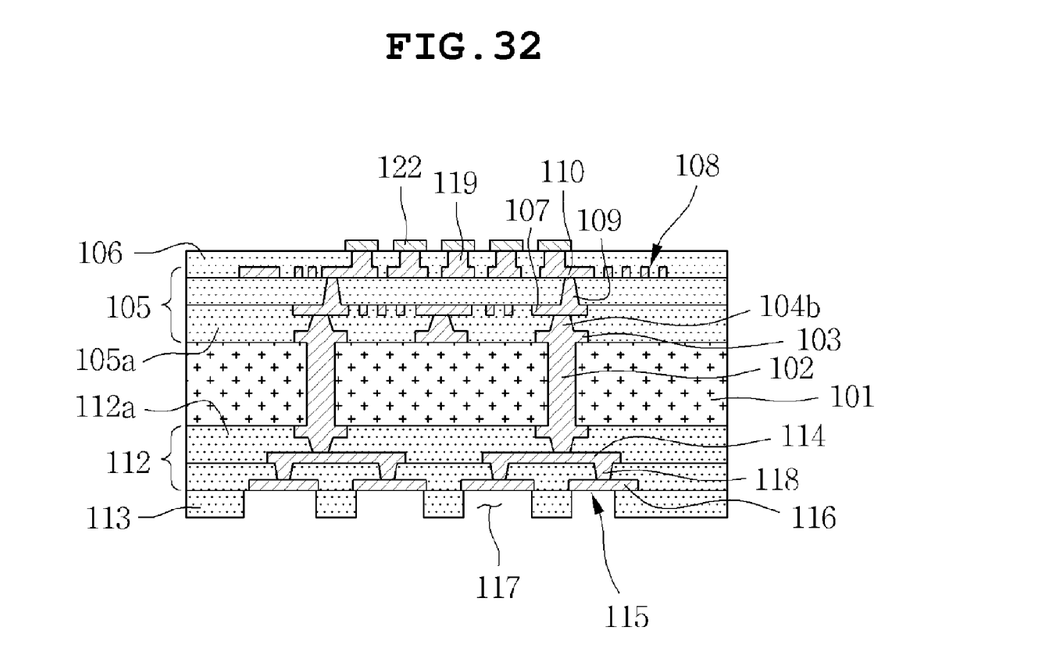

Subsequently, as shown in FIG. 32, connection pads 122 may be further formed on the bump pads 119.

The connection pads 122 function to increase a surface area of the bump pads 119 and thus a contact area required for electrical connection to solder balls (not shown) or external devices (not shown), thus enhancing adhesive force therebetween.

As a consequence of the above-described manufacturing process, the printed circuit board 100b according to the second embodiment of the present invention is obtained, as shown in FIG. 31.

As described above, since the printed circuit board according to the present invention embodies the outermost circuit layer positioned at one side thereof as the trench circuit layer, the risk in which the outermost circuit layer is separated from the outermost insulating layer is reduced.

Also, according to the present invention, since circuit layers other than the trench circuit layer are manufactured using a typical semi-additive process, manufacturing costs and manufacturing time are reduced, and there is no interlayer misalignment which is a problem of a trench circuit layer.

Also, according to the present invention, since the outermost circuit layer positioned at the other side of the printed circuit board is embedded in the outermost insulating layer, the risk of separation of the outermost circuit layer is reduced. Furthermore, the circuit layer can be formed using a tenting process, thus considerably reducing manufacturing costs.

In addition, according to the present invention, the method of forming the trench circuit layer in the outermost circuit layer which is applicable to only a coreless product can also be applied to a printed circuit board including a core substrate.

Although the embodiment of the present invention has been disclosed for illustrative purposes, the embodiment is provided to concretely describe the present invention rather than to limit a printed circuit board and a method of manufacturing the same according to the present invention. Accordingly, those skilled in the art will appreciate that various modifications, additions and substitutions are possible, without departing from the scope and spirit of the invention as disclosed in the accompanying claims, and thus such modifications, additions and substitutions should also be understood as falling within the scope of the present invention.

What is claimed is:

1. A method of manufacturing a printed circuit board, comprising:
   (A) forming core circuit layers on both sides of a core substrate, thus preparing a core layer;
   (B) forming a first protective layer on one side of a carrier while forming a second protective layer on the other side of the carrier, forming pattern trenches on the first protective layer and plating the pattern trenches, thus creating a trench circuit layer, and forming a first build-up layer on the first protective layer while forming a second build-up layer in the second protective layer, thus preparing a carrier layer;
   (C) bonding the carrier layer on each side of the core layer; and
   (D) removing the carrier from each of the carrier layers.

2. The method as set forth in claim 1, wherein (A) preparing the core layer comprises:
   (A1) forming a through-hole in the core substrate;
   (A2) plating the through-hole while forming core circuit layers on the both sides of the core substrate, and forming bumps connected to and protruding from the core circuit layers; and
   (A3) forming core insulating layers on the both sides of the core substrate such that the bumps pass through the core insulating layers.

3. The method as set forth in claim 2, wherein the bumps are composed of metal plating layers or electroconductive metal paste.

4. The method as set forth in claim 1, wherein (B) preparing the carrier layer, comprises:
   (B1) forming release layers on both sides of the carrier;
   (B2) forming the first protective layer on the one side of the carrier on which the release layers were formed while forming the second protective layer on the other side of the carrier;
   (B3) forming the pattern trenches on the first protective layer and plating the pattern trenches, thus creating the trench circuit layer; and
   (B4) forming the first build-up layer on the first protective layer in which the trench circuit layer was formed while forming the second build-up layer in the second protective layer, thus preparing the carrier layer.

5. The method as set forth in claim 1, wherein, in (C) bonding the carrier layer, the first and second protective layers are oriented to face outward.

6. The method as set forth in claim 1, wherein the first and second protective layers are each a solder resist layer.

7. The method as set forth in claim 1, further comprising:
   (E) forming a first opening in the first protective layer such that a first pad of the trench circuit layer is exposed through the first opening, and forming a second opening in the second protective layer such that a second pad of an outermost circuit layer of the second build-up layer is exposed through the second opening.

8. A method of manufacturing a printed circuit board, comprising:
   (A) forming core circuit layers on both sides of a core substrate, thus preparing a core layer;
   (B) forming a first protective layer on one side of a carrier while forming a second protective layer on the other side of the carrier, forming pattern trenches and bump pad trenches on the first protective layer and plating the pattern trenches and the bump pad trenches, thus creating a trench circuit layer and bump pads, and forming a first build-up layer on the first protective layer while forming a second build-up layer in the second protective layer, thus preparing a carrier layer;
   (C) bonding the carrier layer on each side of the core layer; and
   (D) removing the carrier from each of the carrier layers.

9. The method as set forth in claim 8, wherein (A) preparing the core layer comprises:
   (A1) forming a through-hole in the core substrate;
   (A2) plating the through-hole while forming core circuit layers on the both sides of the core substrate, and forming bumps connected to and protruded from the core circuit layers; and
   (A3) forming core insulating layers on the both sides of the core substrate such that the bumps pass through the core insulating layers.

10. The method as set forth in claim 9, wherein the bumps are composed of metal plating layers or electroconductive metal paste.

11. The method as set forth in claim 8, wherein (B) preparing the carrier layer, comprises:
   (B1) forming release layers on both sides of the carrier;
   (B2) forming the first protective layer on the one side of the carrier on which the release layers were formed while forming the second protective layer on the other side of the carrier;
   (B3) forming the pattern trenches and the bump pad trenches on the first protective layer such that the bump pad trenches lead to an outer surface of the release layer, and plating the pattern trenches and the bump pad trenches, thus creating the trench circuit layer and the bump pads; and (B4) forming the first build-up layer on the first protective layer in which the trench circuit layer was formed while forming the second build-up layer in the second protective layer, thus preparing the carrier layer.

12. The method as set forth in claim 8, wherein, in (C) bonding the carrier layer, the first and second protective layers are oriented to face outward.

13. The method as set forth in claim 8, wherein the first and second protective layers are each a solder resist layer.

14. The method as set forth in claim 8, further comprising:
(E) forming a second opening in the second protective layer such that a second pad of an outermost circuit layer of the second build-up layer is exposed through the second opening.

* * * * *